United States Patent
Lee et al.

(10) Patent No.: US 10,184,995 B2
(45) Date of Patent: Jan. 22, 2019

(54) MAGNETIC RESONANCE IMAGING APPARATUS

(71) Applicant: SAMSUNG ELECTRONICS CO., LTD., Suwon-si (KR)

(72) Inventors: Won-je Lee, Suwon-si (KR); Charles Albert Saylor, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 250 days.

(21) Appl. No.: 15/349,102

(22) Filed: Nov. 11, 2016

(65) Prior Publication Data
US 2017/0261572 A1 Sep. 14, 2017

(30) Foreign Application Priority Data
Mar. 9, 2016 (KR) .................. 10-2016-0028354

(51) Int. Cl.
  *G01R 33/28* (2006.01)
  *G01R 33/34* (2006.01)
  *G01R 33/36* (2006.01)
  *G01R 33/565* (2006.01)

(52) U.S. Cl.
  CPC ..... *G01R 33/288* (2013.01); *G01R 33/34076* (2013.01); *G01R 33/36* (2013.01); *G01R 33/5659* (2013.01)

(58) Field of Classification Search
  CPC .............. G01R 33/34076; G01R 33/36; G01R 33/5659
  See application file for complete search history.

(56) References Cited

U.S. PATENT DOCUMENTS

| 7,639,015 B2 | 12/2009 | Thuringer et al. |
| 7,710,117 B2 | 5/2010 | Vaughan et al. |
| 9,714,993 B2 | 7/2017 | Hamamura et al. |
| 2005/0122108 A1* | 6/2005 | Yasuhara ............. G01R 33/341 324/318 |
| 2013/0102880 A1* | 4/2013 | Gulsen ............... G01R 33/4804 600/412 |

(Continued)

FOREIGN PATENT DOCUMENTS

| JP | 7-327948 A | 12/1995 |
| JP | 2013-63334 A | 4/2013 |

(Continued)

OTHER PUBLICATIONS

Communication dated Jun. 1, 2017, issued by the Korean Intellectual Property Office in counterpart Korean Patent Application No. 10-2016-0028354.

(Continued)

*Primary Examiner* — Jermele M Hollington
*Assistant Examiner* — Alvaro Fortich
(74) *Attorney, Agent, or Firm* — Sughrue Mion, PLLC

(57) ABSTRACT

A magnetic resonance imaging apparatus includes: a radio frequency (RF) coil including an endring; a power source configured to respectively supply RF power to each of a first port and a second port of the endring; three probes arranged adjacent to the endring; a voltage detector configured to detect the amplitudes of respective voltages induced to each of the three probes; and a controller configured to estimate a current of the RF coil based on the detected amplitudes of the respective voltages.

10 Claims, 13 Drawing Sheets

(56) References Cited

U.S. PATENT DOCUMENTS

2013/0147484 A1* 6/2013 Shah .................... G01R 33/583
                                                         324/318
2014/0197836 A1  7/2014 Hamamura et al.
2015/0168516 A1  6/2015 Eberler et al.

FOREIGN PATENT DOCUMENTS

| JP | 2013-81212 A   | 5/2013 |
| JP | 2014-133135 A  | 7/2014 |
| WO | 2002/052291 A1 | 7/2002 |
| WO | 2007/049166 A1 | 5/2007 |

OTHER PUBLICATIONS

Communication dated Oct. 10, 2017 by the Korean Intellectual property Office in counterpart Korean Patent Application No. 10-20160028354.

Glenn F. Engen, et al., "The Six-Port Reflectometer: An Alternative Network Analyzer", IEEE Transactions on Microwave Theory and Techniques, vol. MTT-25, No. 12, Dec. 1977, pp. 1075-1080.

* cited by examiner

This application claims priority from Korean Patent Application No. 10-2016-0028354, filed on Mar. 9, 2016, in the Korean Intellectual Property Office, the disclosure of which is incorporated herein by reference in its entirety.

MAGNETIC RESONANCE IMAGING APPARATUS

CROSS-REFERENCE TO RELATED APPLICATION

This application claims priority from Korean Patent Application No. 10-2016-0028354, filed on Mar. 9, 2016, in the Korean Intellectual Property Office, the disclosure of which is incorporated herein by reference in its entirety.

BACKGROUND

1. Field

The present disclosure relates to magnetic resonance imaging (MRI) apparatuses, and more particularly, to MRI apparatuses that may efficiently estimate a current of a radio frequency (RF) coil.

2. Description of the Related Art

A magnetic resonance imaging (MRI) apparatus is an apparatus that images an object by using a magnetic field. Since the MRI apparatus three-dimensionally shows a disk, a joint, a nerve, and a ligament, etc. at a desired angle, the MRI apparatus is widely used for accurate diagnosis of a disease. A magnetic resonance image may be obtained by sampling a magnetic resonance (MR) signal, obtaining digital data in a k space, and generating image data based on the obtained digital data.

Recently, researches into technology that may improve the quality of a magnetic resonance image without increasing a time of obtaining the magnetic resonance image is under progress.

SUMMARY

Provided are MRI apparatuses for efficiently estimating a current of a radio frequency (RF) coil.

Additional aspects will be set forth in part in the description which follows and, in part, will be apparent from the description, or may be learned by practice of the presented exemplary embodiments.

According to an aspect of an exemplary embodiment, a magnetic resonance imaging apparatus includes: a radio frequency (RF) coil including an endring; a power source configured to respectively supply RF powers to a first port and a second port of the endring; three probes adjacent to the endring; a voltage detector configured to detect the amplitudes of voltages respectively induced to the three probes; and a controller configured to estimate a current of the RF coil based on the amplitudes of the plurality of voltages detected for the three probes.

The controller may estimate the amplitude of a first current flowing through the RF coil by using a first power source, the amplitude of a second current flowing through the RF coil by using a second power source, and a phase difference between the first current and the second current based on the amplitudes of the plurality of voltages.

The power source may supply orthogonal RF powers to the first port and the second port of the endring.

The first port and the second port of the endring may be separated from each other with an interval of about 90° with respect to the endring.

Two probes from among the three probes, and the first port and the second port may be respectively arranged with an interval of about 90° with respect to the endring.

The controller may further estimate at least one of a coil power loss (CPL) and a specific absorption rate (SAR) based on the estimated current of the RF coil.

The magnetic resonance imaging apparatus may further include an additional probe adjacent to the endring, the voltage detector further detecting the amplitude of a voltage induced to the additional probe, and the controller estimating a current of the RF coil further based on the amplitude of the voltage detected for the additional probe.

The endring may include N ports including the first port and the second port, the power source may respectively supply RF powers to the N ports, the magnetic resonance imaging apparatus may further include (2N-1) or more probes including the three probes, the (2N-1) or more probes being adjacent to the endring, the voltage detector may detect the amplitudes of voltages respectively induced to the (2N-1) or more probes, and the controller may estimate a current of the RF coil based on the amplitudes of the plurality of voltages detected for the (2N-1) or more probes.

The voltage detector may detect the amplitudes of the voltages respectively induced to the three probes by using heterodyne detection.

The voltage detector may include an oscillator configured to generate a reference signal of a reference frequency and a mixer configured to mix voltages respectively induced to the three probes with the reference signal, and output a voltage of a frequency lower than the frequency of the voltage by the reference frequency.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
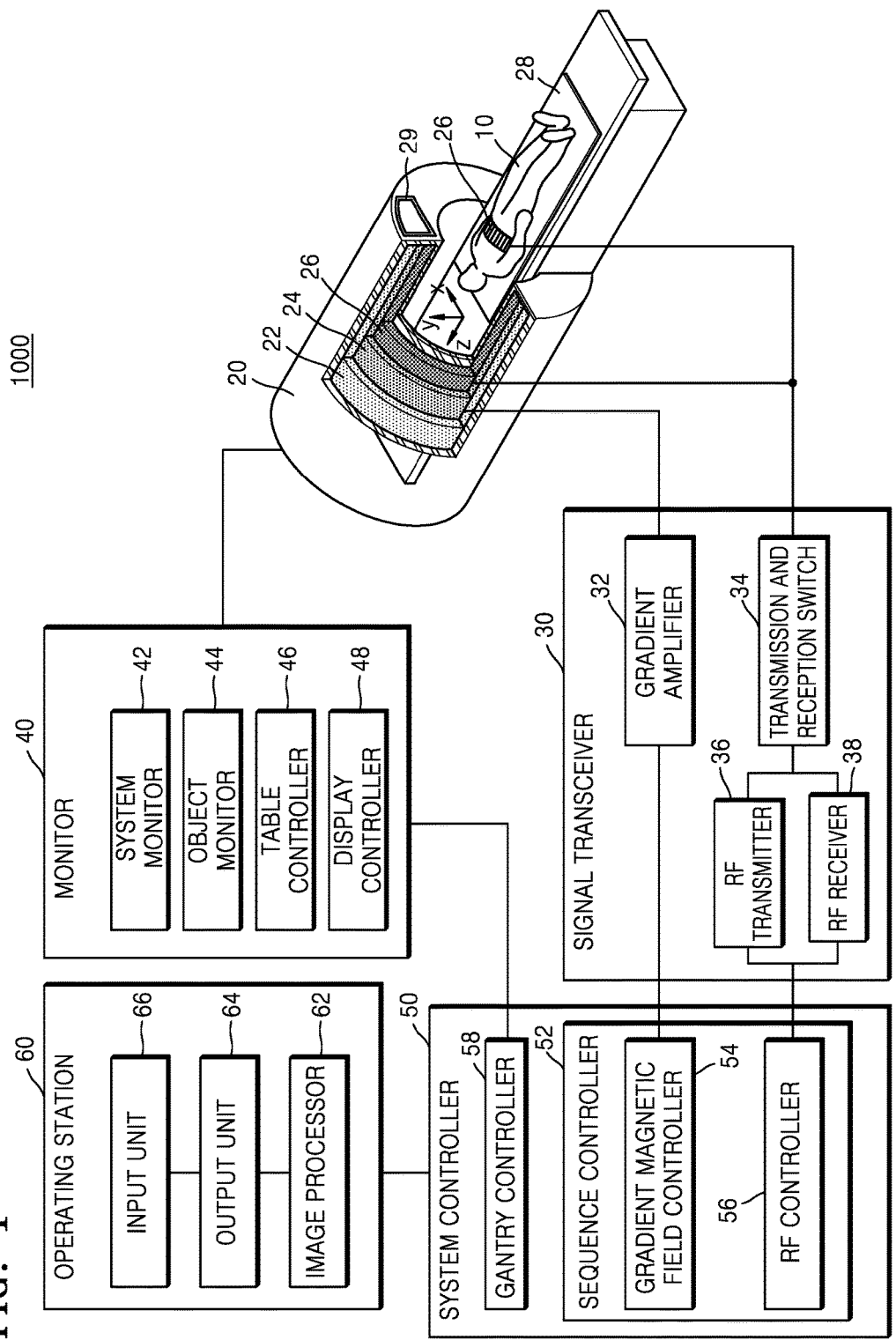
FIG. 1 is a block diagram of a general magnetic resonance imaging (MRI) system.

Advantages and features of one or more exemplary embodiments and methods of accomplishing the same may be understood more readily by reference to the following detailed description of the exemplary embodiments and the accompanying drawings. In this regard, the present exemplary embodiments may have different forms and should not be construed as being limited to the descriptions set forth herein. Rather, these exemplary embodiments are provided so that this disclosure will be thorough and complete and will fully convey the concept of the present exemplary embodiments to one of ordinary skill in the art, and the present inventive concept will only be defined by the appended claims.

Hereinafter, the terms used in the specification will be briefly described, and then the present disclosure will be described in detail.

The terms used in this specification are those general terms currently widely used in the art in consideration of functions regarding the exemplary embodiments, but the terms may vary according to the intention of those of ordinary skill in the art, precedents, or new technology in the art. Also, some terms may be arbitrarily selected by the applicant, and in this case, the meaning of the selected terms will be described in detail in the detailed description of the present specification. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to exemplary embodiments, examples of which are illustrated in the accompanying drawings. In the following description, well-known functions or constructions are not described in detail so as not to obscure the exemplary embodiments with unnecessary detail.

Throughout the specification, an "image" may denote multi-dimensional data composed of discrete image elements (for example, pixels in a two-dimensional image and voxels in a three-dimensional image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI system is an apparatus which is configured for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics which are different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a block diagram of a general MRI system 1000. Referring to FIG. 1, the general MRI system 1000 may include a gantry 20, a signal transceiver 30, a monitoring unit (also referred to herein as a "monitor") 40, a system control unit (also referred to herein as a "system controller") 50, and an operating unit (also referred to herein as an "operating station") 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-axis, Y-axis, and Z-axis directions crossing each other at right angles. The gradient coil 24 may provide location information of each region of the object 10 by variably inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby generating an emission of electromagnetic waves having a Larmor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil that corresponds to a specific part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 via either or both of the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-axis, Y-axis, and Z-axis directions may be synthesized.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 via the RF coil 26 during a transmission mode, and receive the MR signal from the object 10 via the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, and/or a temperature measurer for measuring a temperature of the object 10.

The table controller 46 controls a movement of the table 28 upon which the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the internal display to be on or off, and may control a screen image to be output on the display 29 and the internal display. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system 1000.

The operating unit 60 may include an image processor 62 for receiving and processing the MR signal received by the RF receiver 38, an output unit 64, and an input unit 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

If needed, the image processor 62 may perform a composition process or difference calculation process on the image data. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user to manipulate the MRI system 1000, such as a user interface (UI), user information, or object information. The output unit 64 may include any of a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, and/or any one of other various output devices that are well known to one of ordinary skill in the art.

The user may input object information, parameter information, a scan condition, a pulse sequence, or information about image composition or difference calculation by using the input unit 66. The input unit 66 may include any of a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be apparent to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system 1000 may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
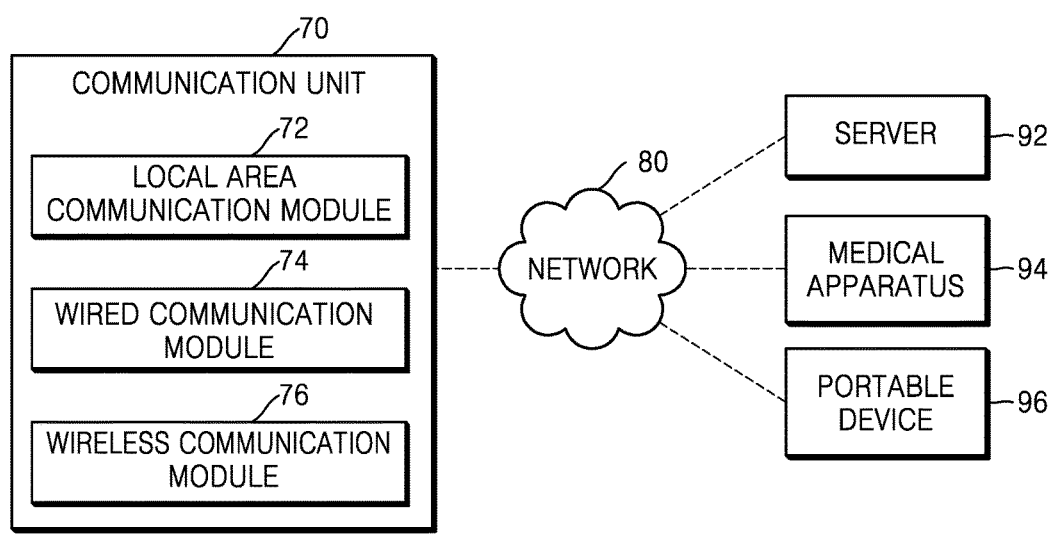
FIG. 2 is a block diagram of a configuration of a communication unit, according to an exemplary embodiment.

FIG. 2 is a block diagram of a communication unit 70, according to an exemplary embodiment. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected via a picture archiving and communication system (PACS), and perform data communication according to the digital imaging and communications in medicine (DICOM) standard.

As shown in FIG. 2, the communication unit 70 may be connected to a network 80 by wire or wirelessly to facilitate communication with a server 92, a medical apparatus 94, and/or a portable device 96.

In detail, the communication unit 70 may transmit and receive data related to the diagnosis of an object via the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI system 1000 or about a medical image quality to a user via the network 80, and receive a feedback regarding the information from the user.

The communication unit 70 may include at least one component enabling communication with an external apparatus.

For example, the communication unit 70 may include a local area communication module 72, a wired communication module 74, and a wireless communication module 76. The local area communication module 72 refers to a module for performing local area communication with an apparatus within a predetermined distance. Examples of local area communication technology according to an exemplary embodiment include, but are not limited to, a wireless local area network (LAN), wireless fidelity (Wi-Fi), Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an exemplary embodiment include wired communication techniques using a pair cable, a coaxial cable, and an optical fiber cable, and other well-known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
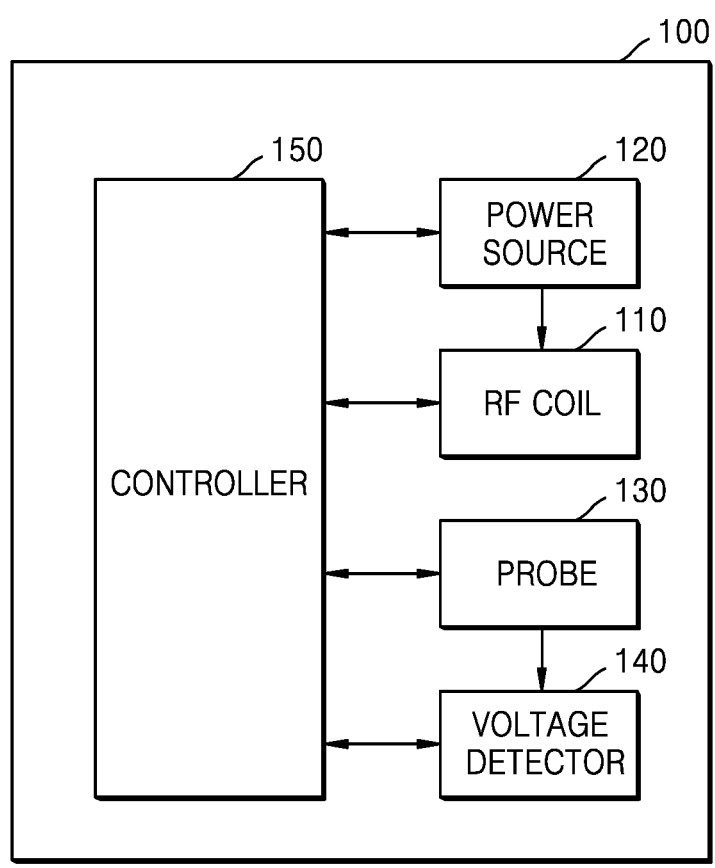
FIG. 3 is a block diagram of an MRI apparatus, according to an exemplary embodiment.

FIG. 3 is a block diagram of an MRI apparatus 100, according to an exemplary embodiment.

Referring to FIG. 3, the MRI apparatus 100 may include an RF coil 110, a power source 120, a probe 130, a voltage detector 140, and a controller 150. The MRI apparatus 100 of FIG. 3 may be included in the MRI system 1000 or a portion of the MRI system 1000 described with reference to FIG. 1. Therefore, the above-described content is applicable to the MRI apparatus 100 of FIG. 3.

The RF coil 110 is configured to irradiate an RF signal. The RF coil 110 may be configured to receive an MR signal emitted from an object. The RF coil 110 is a configuration corresponding to the RF coil 26 of FIG. 1 and the above-described content is applicable to the RF coil 110.

The power source 120 is configured to supply RF power to the RF coil 110. The RF power may be also referred to as an RF pulse of a Larmor frequency. The RF coil 110 may be driven by the power source 120. The power source 120 may be the RF transmitter 36 of FIG. 1, or may be included in the RF transmitter 36, or may be connected to the RF transmitter 36.

A current flows through the RF coil 110 by using the RF power supplied by the power source 120, and an RF magnetic field may be generated around the RF coil 110. The RF magnetic field generated around the RF coil 110 serves as an RF signal irradiated to an object. The RF magnetic field is also referred to as a B1 field. When the B1 field is applied to an atomic nucleus inside the object, the atomic nucleus may transition from a low energy state to an excitation state, which is a high energy state.

The probe 130 may be arranged adjacent to the RF coil 110. The probe 130 may be inductively coupled to the B1 field generated by the RF coil 110. Due to the inductive coupling, a voltage may be induced to the probe 130. The probe 130 may be used to estimate a current inside the RF coil 110 during excitation. The probe 130 may be also referred to as a pickup probe.

The voltage detector 140 is configured to detect the amplitude of a voltage induced to the probe 130. The voltage detector 140 may be at least one of a power sensor, a power detector, and a voltage measuring device.

The controller 150 may control an overall operation of the MRI apparatus 100 and process various data. The controller 150 may control the power source 120 to supply RF power to the RF coil 110. The controller 150 may control the voltage detector 140 to detect the amplitude of a voltage induced to the probe 130.

The controller 150 may include any of a central processing unit (CPU), a microprocessor, a graphic processing unit (GPU), etc., but is not limited thereto.

The controller 150 may include, or may be included in, or may be connected to at least one of the monitoring unit 40, the system monitoring unit 42, the sequence controller 52, and the RF controller 56 of FIG. 1.

Figure 4:
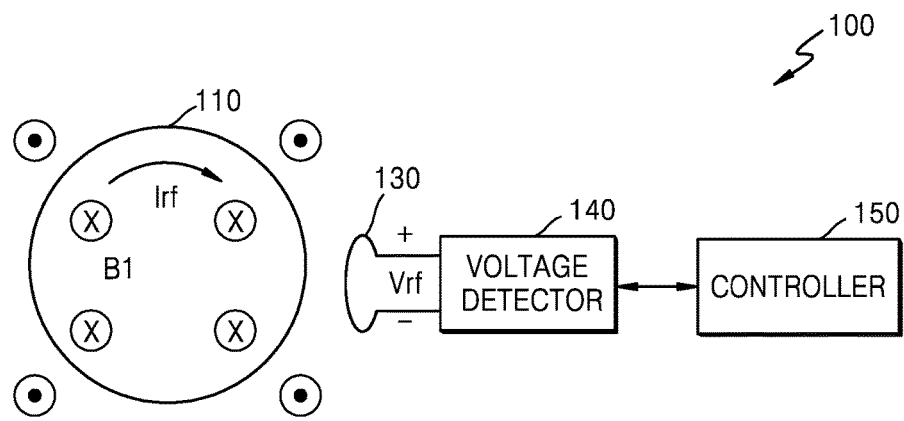
FIG. 4 is a block diagram for explaining an operation of an MRI apparatus, according to an exemplary embodiment.

FIG. 4 is a block diagram for explaining an operation of an MRI apparatus 100, according to an exemplary embodiment.

Referring to FIG. 4, the power source 120 may supply RF power to the RF coil 110. By the RF power supplied by the power source 120, a current Irf flows through the RF coil 110. By the current Irf, a B1 field B1 may be generated around the RF coil 110.

The probe 130 may be inductively coupled to the B1 field B1, and a voltage Vrf may be induced to the probe 130. The voltage detector 140 may detect the amplitude of the voltage Vrf induced to the probe 130.

The controller 150 may estimate the current Irf flowing through the RF coil 110 based on the amplitude of the voltage Vrf detected by the voltage detector 140. Each of the current Irf flowing through the RF coil 110 and the voltage Vrf induced to the probe 130 may have a respective amplitude and a respective phase.

The controller 150 may estimate a current distribution of the RF coil 110 via the estimated current Irf. The controller 150 may estimate a coil power loss (CPL), which is power dissipated at the RF coil 110, based on the current distribution of the RF coil 110. The controller 150 may estimate a local specific absorption rate (SAR) and a global SAR based on the current distribution of the RF coil 110. The SAR denotes a degree of a rate of energy absorbed by an object when the object is exposed to an RF electromagnetic field. For example, the SAR may be estimated based on a CPL and power (power supplied by the power source 120) transmitted to the RF coil 110. The local SAR, which is close to the RF coil 110, may be proportional to the square of a current. Therefore, the controller 150 may estimate the local SAR by estimating a current flowing through the RF coil 110.

When the SAR is high, the SAR is harmful to an object, and therefore, the controller 150 needs to monitor the SAR in order to guarantee the safety of the object. The controller 150 may control the power source 120 in order to adjust RF power supplied to the RF coil 110 such that the SAR does not exceed a predetermined threshold.

For the safety of an object and the optimized performance of the MRI apparatus 100, accurate estimation of a current flowing through the RF coil 110 and the CPL may be required.

Figure 5:
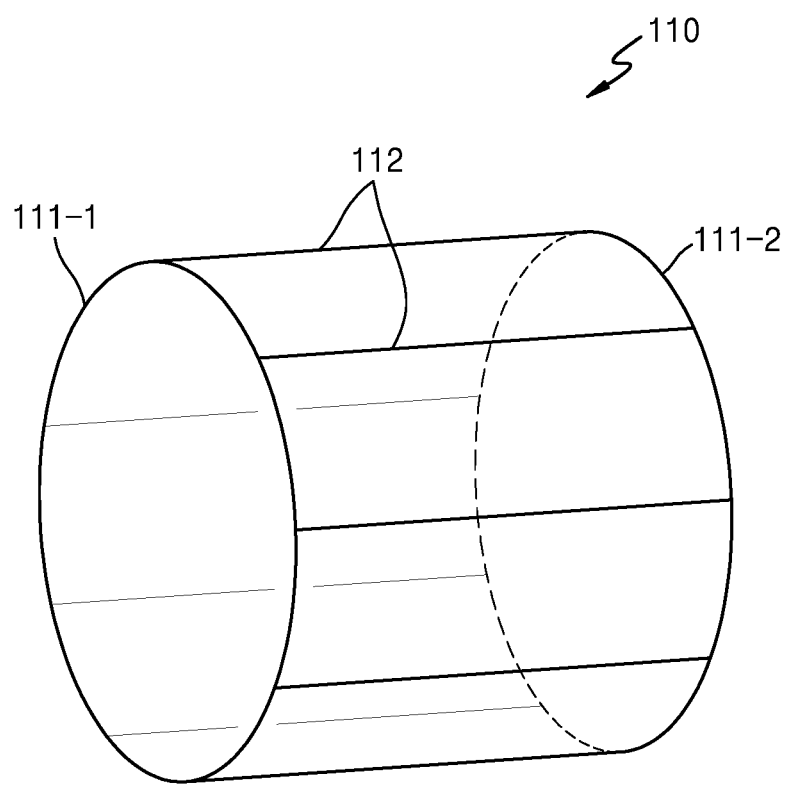
FIG. 5 is a diagram of an example of a radio frequency (RF) coil of the MRI apparatus of FIG. 3.

FIG. 5 is a diagram of an example of the RF coil 110 of the MRI apparatus of FIG. 3.

Referring to FIG. 5, the RF coil 110 may include two endrings 111-1 and 111-2 and at least one rung 112. Both ends of the RF coil 110 may include the two endrings 111-1 and 111-2. The two endrings 111-1 and 111-2 may be connected to each other via the at least one rung 112. The number and arrangement of rungs 112 illustrated in FIG. 4 are merely exemplary and are not limited thereto.

The RF coil 110 of FIG. 5 may be an example of the RF coil 26 inside the gantry 20 of FIG. 1. The RF coil 110 inside the gantry 20 is also referred to as a whole body coil.

Figure 6:
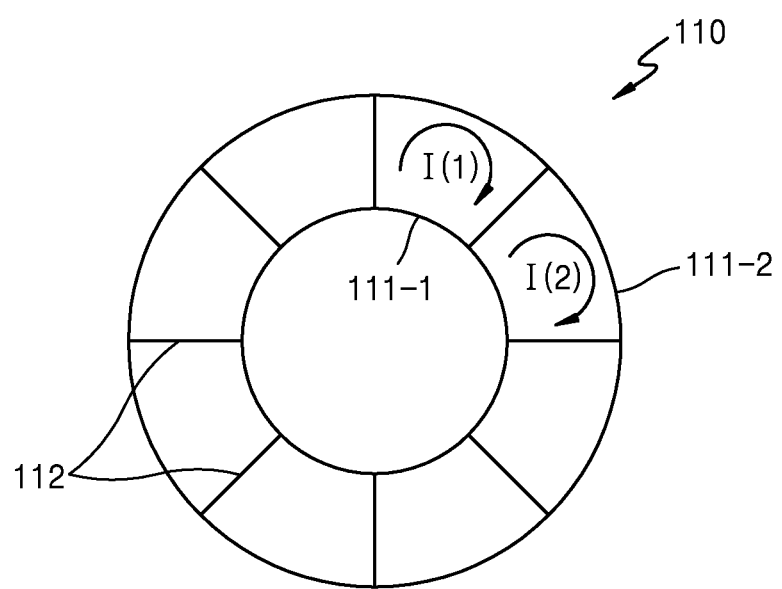
FIG. 6 is a diagram for explaining a current distribution in the RF coil of FIG. 5.

FIG. 6 is a diagram for explaining a current distribution in the RF coil 110 of FIG. 5.

Referring to FIG. 6, the RF coil 110 may include two endrings 111-1 and 111-2 and eight rungs 112. Each of the endrings 111-1 and 111-2 may be divided into segments by the rungs 112. Each of the first endring 111-1 and the second endring 111-2 may be divided into eight segments by the eight rungs 112. The segments of the first endring 111-1 and the second endring 111-2 and two rungs in the RF coil 110 may form current paths I(1) and I(2). Though FIG. 6 illustrates only two current paths I(1) and I(2), nine current paths may be formed in the RF coil 110 by the eight rungs 112 and the endrings.

Equivalent circuits of the current paths I(1) and I(2) may be inductor-capacitor-resistor (LCR) circuits. The RF coil 110 may have a multi-resonance structure in which each LCR circuit is in a resonance state.

Hereinafter, a method of estimating a current flowing through the RF coil 110 of the MRI apparatus according to an exemplary embodiment is described.

Figure 7:
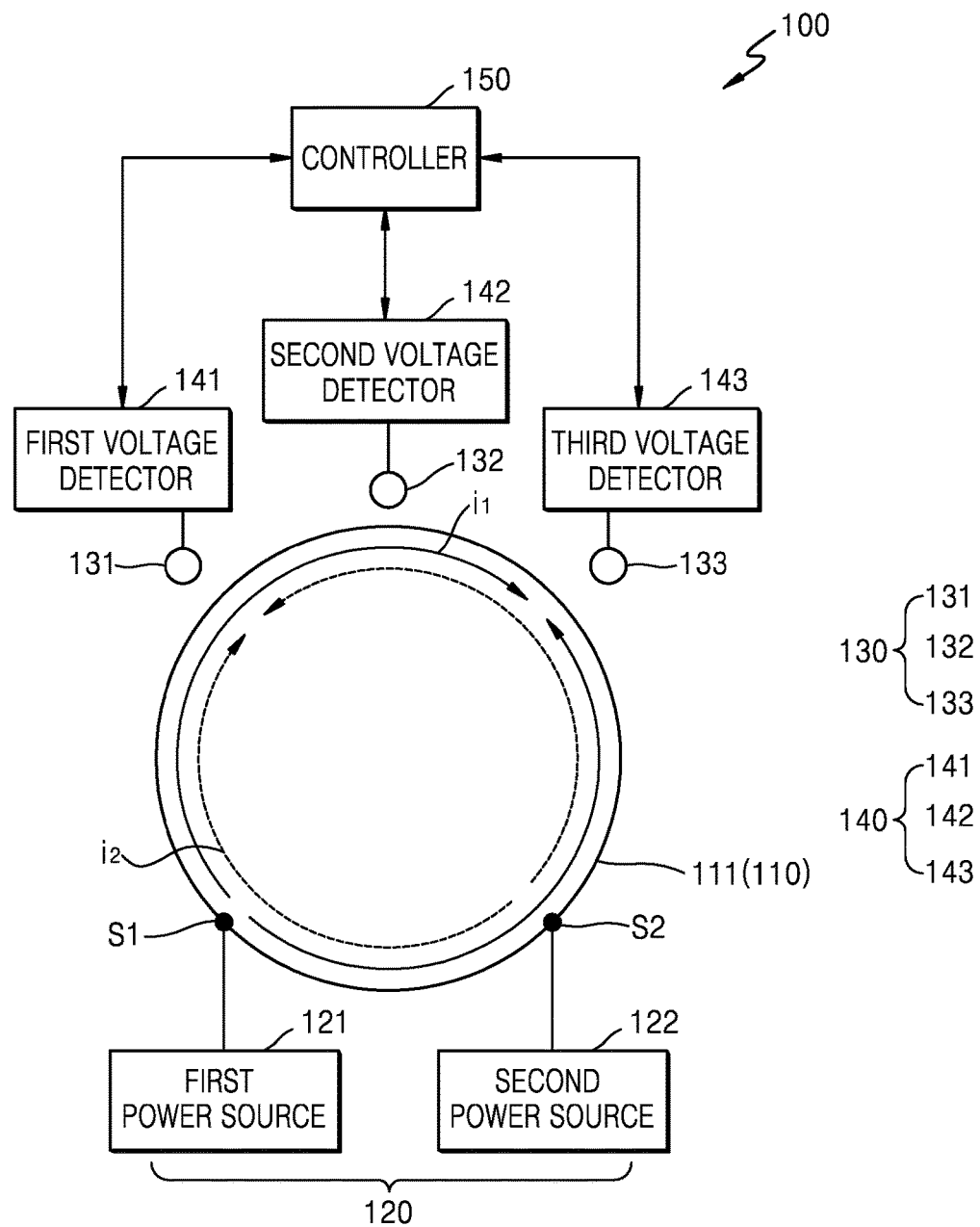
FIG. 7 is a block diagram of an example of the MRI apparatus of FIG. 3.

FIG. 7 is a block diagram of an example of the MRI apparatus 100 of FIG. 3.

Referring to FIG. 7, the MRI apparatus 100 may include the RF coil 110, the power source 120, the probe 130, the voltage detector 140, and the controller 150.

The power source 120 may include a first power source 121 and a second power source 122. The first power source 121 and the second power source 122 may supply RF power to the RF coil 110. The first power source 121 may supply RF power to a first port S1 of an endring 111, and the second power source 122 may supply RF power to a second port S2 of the endring 111. The power source 120 may supply RF power to one of the two endrings 111-1 and 111-2 of the RF coil 110.

A phase difference between RF power supplied to the first port S1 and RF power supplied to the second port S2 may be about 90°. Driving the RF coil 110 by using RF powers having a phase difference of about 90° and rotating in the same direction as that of a proton is also referred to as quadrature driving or circular polarization.

A technique in which the RF coil 110 receives a plurality of RF powers as illustrated in FIG. 7 is referred to as a multi-transmit technique. Homogeneity of a B1 field generated by the RF coil 110 may be improved by supplying independently separated RF powers. The multi-transmit technique is an example of a B1 shimming, which is a process of generating a uniform B1 field.

Though FIG. 7 illustrates that different power sources 121 and 122 supply RF power to the ports S1 and S2 indepen-
dently, the exemplary embodiment is not limited thereto. As another example, one power source 120 may supply RF power to different ports S1 and S2. The MRI apparatus 100 may further include a splitter for supplying RF power from the power source 120 to the two ports S1 and S2. The splitter may delay RF power to be supplied to one of the two ports S1 and S2 such that a phase difference between RF powers supplied to the two ports S1 and S2 occurs.

Since RF power is supplied to the different ports S1 and S2, a current distribution of the RF coil 110 may be represented by sum of two currents $i_1$ and $i_2$. The first current $i_1$ is a current of the RF coil 110 resulting from RF power supplied by the first power source 121, and the second current $i_2$ is a current of the RF coil 110 resulting from RF power supplied by the second power source 122. The first current $i_1$ and the second current $i_2$ are independent, and the controller 150 may process the current distribution of the RF coil 110 via independent current modes. The independent current modes include a first current mode for the first current $i_1$ and a second current mode for the second current $i_2$.

To estimate the current distribution of the RF coil 110, the controller 150 may require measurements of the amplitude of the first current $i_1$, the amplitude of the second current $i_2$, and a phase difference between the first current $i_1$ and the second current $i_2$. The controller 150 may calculate a CPL and estimate an SAR based on the amplitude of the first current $i_1$, the amplitude of the second current $i_2$, and the phase difference between the first current $i_1$ and the second current $i_2$.

Each of the plurality of probes 130 may be arranged adjacent to the endring 111 of the RF coil 110. The plurality of probes 130 may include a first probe 131, a second probe 132, and a third probe 133. The probes 130 may be arranged at three different points, all of which are adjacent to the RF coil 110.

Respective voltages may be induced to each probe of the plurality of probes 130. A first voltage may be induced to the first probe 131, a second voltage may be induced to the second probe 132, and a third voltage may be induced to the third probe 133.

The voltage detector 140 may detect the amplitudes of the respective voltages induced to the plurality of probes 130. The voltage detector 140 may include a first voltage detector 141, a second voltage detector 142, and a third voltage detector 143.

The first voltage detector 141 may detect the amplitude of the first voltage induced to the first probe 131. The second voltage detector 142 may detect the amplitude of the second voltage induced to the second probe 132. The third voltage detector 143 may detect the amplitude of the third voltage induced to the third probe 133.

The controller 150 may estimate the first current $i_1$ and the second current $i_2$ of the RF coil 110 based on the amplitudes of the respective voltages detected by the voltage detector 140, that is, the amplitude of the first voltage, the amplitude of the second voltage, and the amplitude of the third voltage.

The controller 150 may estimate the amplitude of the first current $i_1$, the amplitude of the second current $i_2$, and the phase difference between the first current $i_1$ and the second current $i_2$ based on the amplitude of the first voltage, the amplitude of the second voltage, and the amplitude of the third voltage.

The first voltage induced to the first probe 131 may be represented by Equation 1 below.

$$V_{P1} = \alpha_1 \beta_{11} i_1 + \alpha_1 \beta_{12} i_2 \qquad \text{Equation 1}$$

In Equation 1, $\alpha_1$ denotes coupling between a current of the endring 111 and the first probe 131, $\beta_{11}$ denotes a relative amplitude of the first current $i_1$ in the first probe 131, and $\beta_{12}$ denotes a relative amplitude of the second current $i_2$.

The second voltage induced to the second probe 132 may be represented by Equation 2 below.

$$V_{P2} = \alpha_2 \beta_{21} i_1 + \alpha_2 \beta_{22} i_2 \quad \text{Equation 2}$$

In Equation 2, $\alpha_2$ denotes coupling between a current of the endring 111 and the second probe 132, $\beta_{21}$ denotes a relative amplitude of the first current $i_1$ in the second probe 132, and $\beta_{22}$ denotes a relative amplitude of the second current $i_2$.

The third voltage induced to the third probe 133 may be represented by Equation 3 below.

$$V_{P3} = \alpha_3 \beta_{31} i_1 + \alpha_3 \beta_{32} i_2 \quad \text{Equation 3}$$

In Equation 3, $\alpha_3$ denotes coupling between a current of the endring 111 and the third probe 133, $\beta_{31}$ denotes a relative amplitude of the first current $i_1$ in the third probe 133, and $\beta_{32}$ denotes a relative amplitude of the second current $i_2$.

In the case where the RF coil 110 includes sixteen rungs, the current distribution of the endring 111 during an imaging mode may be represented by Equation 4 and Equation 5.

$$i_1(n) = I_{1,amp} \cos(2\pi n/16) \exp(j\omega t) \quad \text{Equation 4}$$

$$i_2(n) = I_{2,amp} \sin(2\pi n/16) \exp(j(\omega t - \theta)) \quad \text{Equation 5}$$

In Equation 4 and Equation 5, n denotes an endring segment.

The controller 150 may estimate the amplitude $I_{1,amp}$ of the first current $i_1$, the amplitude $I_{2,amp}$ of the second current $i_2$, and a phase difference $\theta$ between the first current $i_1$ and the second current $i_2$ by using the amplitude of the first voltage, the amplitude of the second voltage, the amplitude of the third voltage detected by the voltage detector 140, and Equations 1 to 5. For example, the controller 150 may estimate the amplitude $I_{1,amp}$ of the first current $i_1$, the amplitude $I_{2,amp}$ of the second current $i_2$, and a phase difference $\theta$ between the first current $i_1$ and the second current $i_2$ of Equation 4 and Equation 5 by inputting the amplitude of the first voltage, the amplitude of the second voltage, the amplitude of the third voltage detected by the voltage detector 140 into Equations 1, 2, and 3.

The controller 150 may obtain three equations (e.g. Equations 1, 2, and 3) regarding a relation between respective voltages induced to the probes 130 and the first and second currents $i_1$ and $i_2$ by using the three probes 130. Since unknowns which the controller 150 intends to obtain are the amplitude $I_1$ of the first current $i_1$, the amplitude $I_2$ of the second current $i_2$, and the phase difference $\theta$, the controller 150 may calculate three unknowns from three equations.

The MRI apparatus 100 may estimate the amplitude $I_1$ of the first current $i_1$, the amplitude $I_2$ of the second current $i_2$, and the phase difference $\theta$ using only the voltage detector 140 by using the three probes 130. The voltage detector 140 may detect only the amplitudes of the respective voltages induced to the probes 130. The voltage detector 140 does not need to detect the phases of the respective voltages induced to the probes 130. Therefore, the MRI apparatus 100 according to an exemplary embodiment does not require a high-priced voltage detector that may detect even the phase of a voltage. Also, the MRI apparatus 100 does not require a phase sensitive detector. According to an exemplary embodiment, since the voltage detector 140 may detect only the amplitude of the respective voltages induced to the probes 130 and thus the voltage detector 140 may be implemented at a relatively low cost, a low-priced MRI apparatus 100 may be provided.

Figure 8:
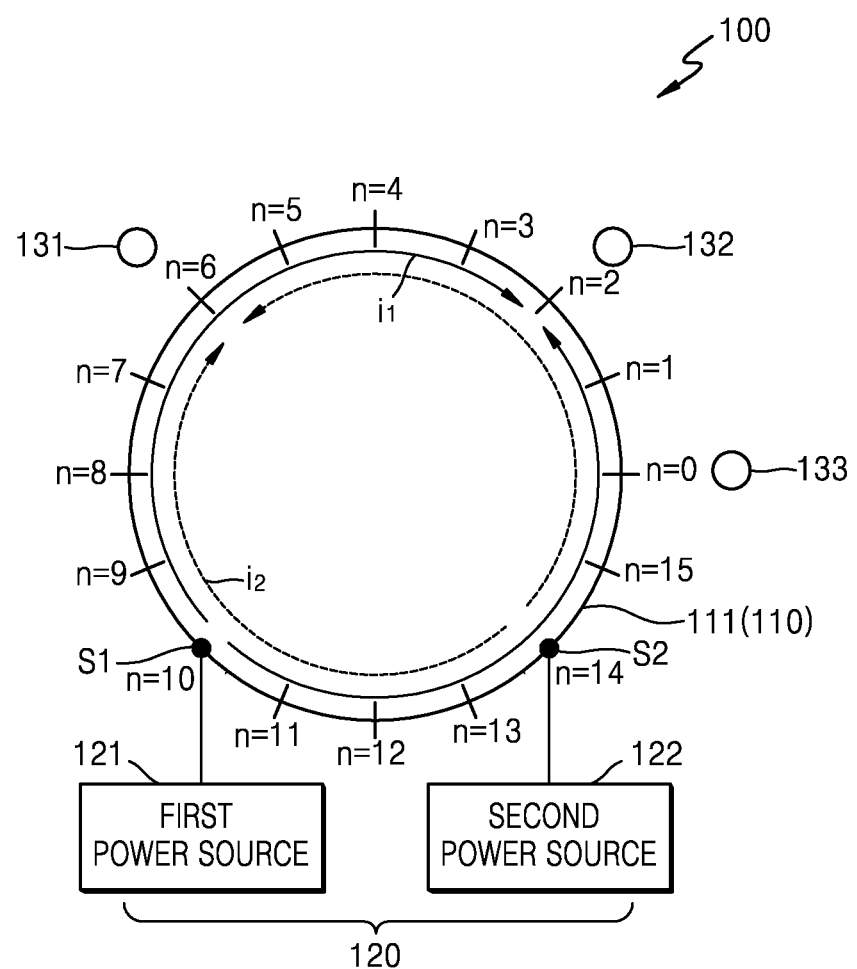
FIG. 8 is a diagram for explaining a method in which an MRI apparatus estimates a current of an RF coil based on the amplitudes of a plurality of voltages detected for probes, according to an exemplary embodiment.

FIG. 8 is a diagram for explaining a method in which an MRI apparatus estimates a current of an RF coil based on the amplitudes of a plurality of respective voltages detected for probes, according to an exemplary embodiment.

Referring to FIG. 8, it is illustrated that the endring 111 of the RF coil 110 is divided into sixteen endring segments ranging from n=0 to n=15. The power source 120 may include the first power source 121 and the second power source 122. It is illustrated that the first power source 121 supplies RF power to the first port S1 for which n=10, and the second power source 122 supplies RF power to the second port S2 for which n=14. Also, it is illustrated that the first probe 131, the second probe 132, and the third probe 133 are respectively arranged at n=6, n=2, and n=0. The locations of the probes 131, 132, and 133 with respect to the endring 111 illustrated in FIG. 8 and the locations of the ports S1 and S2 to which RF power is supplied are only examples for explaining a method of estimating a current of the RF coil, and the locations are not limited thereto.

During an imaging mode or a dominant mode, a current distribution may be represented by Equation 6 below.

$$\beta i_1(n, t) = I_1 \cos\left(2\pi \frac{n}{N}\right) e^{j\omega t} \quad \text{Equation 6}$$

$$\beta i_2(n, t) = I_2 \sin\left(2\pi \frac{n}{N}\right) e^{j(\omega t - \theta)}$$

In Equation 6, N denotes the number of endring segments, and n is an endring segment. In the structure illustrated in FIG. 8, N may be equal to 16. In Equation 6, $\beta$ is a relative amplitude of the currents $i_1$ and $i_2$ in the endring segment n.

The voltages for time and space induced to the first probe 131, the second probe 132, and the third probe 133 may be represented by Equation 7 below.

$$V_{P1}(n,t) = \alpha_1 \beta_{11} i_1(n,t) + \alpha_1 \beta_{12} i_2(n,t)$$

$$V_{P2}(n,t) = \alpha_2 \beta_{21} i_1(n,t) + \alpha_2 \beta_{22} i_2(n,t)$$

$$V_{P3}(n,t) = \alpha_3 \beta_{31} i_1(n,t) + \alpha_3 \beta_{32} i_2(n,t) \quad \text{Equation 7}$$

In Equation 7, since the amplitudes $|V_{P1}(n,t)|, |V_{P2}(n,t)|, |V_{P3}(n,t)|$ of the respective voltages induced to the probes 131, 132, and 133 are detected by the voltage detector 140 (see FIG. 7), they are known values. In Equations 6 and 7, $I_1$, $I_2$, and the phase difference $\theta$ are unknowns.

Assuming that the first probe 131, the second probe 132, and the third probe 133 are the same and the distances from the first probe 131, the second probe 132, and the third probe 133 to the endring 111 are the same, Equation 8 below may be satisfied as a result of calibration.

$$\alpha_1 = \alpha_2 = \alpha_3 = \alpha = 1 \quad \text{Equation 8}$$

From Equations 6, 7, and 8, Equation 9 may be derived.

$$V_{P1}(6, 0) = \quad \text{Equation 9}$$
$$\cos\left(\frac{3}{4}\pi\right)I_1 + \sin\left(\frac{3}{4}\pi\right)I_2 e^{j\theta} = \frac{1}{\sqrt{2}}(-I_1 + I_2 \cos\theta + jI_2 \sin\theta)$$

$$V_{P2}(2, 0) = \cos\left(\frac{\pi}{4}\right)I_1 + \sin\left(\frac{\pi}{4}\right)I_2 e^{j\theta} =$$
$$\frac{1}{\sqrt{2}}(I_1 + I_2 \cos\theta + jI_2 \sin\theta)$$

$$V_{P3}(0, 0) = I_1$$

When defining $|V_{P1}(6,0)|,|V_{P2}(2,0)|,|V_{P3}(0,0)|$ as Equation 10 below, Equation 11 may be derived.

$$|V_{P1}(6,0)|=V_1$$

$$|V_{P2}(2,0)|=V_2$$

$$|V_{P3}(0,0)|=V_3 \quad \text{Equation 10}$$

$$2V_1^2 = I_1^2 - 2I_1I_2\cos\theta + I_2^2\cos^2\theta + I_2^2\sin^2\theta = V_3^2 - 2V_3I_2\cos\theta + I_2^2$$

$$2V_2^2 = I_1^2 + 2I_1I_2\cos\theta + I_2^2\cos^2\theta + I_2^2\sin^2\theta = V_3^2 + 2V_3I_2\cos\theta + I_2^2$$

$$2(V_1^2 + V_2^2) = 2V_3^2 + 2I_2^2 \quad \text{Equation 11}$$

From Equation 11, $I_2$ may be derived as in Equation 12.

$$I_2 = \sqrt{V_1^2 + V_2^2 - V_3^2} \quad \text{Equation 12}$$

From Equation 11 and Equation 12, $\cos\theta$ may be derived as in Equation 13.

$$2V_1^2 = V_3^2 - 2V_3I_2\cos\theta + (V_1^2 + V_2^2) - V_3^2 \quad \text{Equation 13}$$

$$V_1^2 - V_2^2 = -2V_3\sqrt{V_1^2 + V_2^2 - V_3^2}\cos\theta$$

$$\cos\theta = \frac{v_1^2 - v_2^2}{-2v_3\sqrt{v_1^2 + v_2^2 - v_3^2}}$$

In summary, the amplitude $I_1$ of the first current, the amplitude $I_2$ of the second current, and the phase difference $\theta$ between the first current and the second current, which are unknowns, may be obtained from the amplitudes $V_1$, $V_2$, and $V_3$ detected by the voltage detector 140 (see FIG. 7) and induced to the probes 131, 132, and 133.

Figure 9:
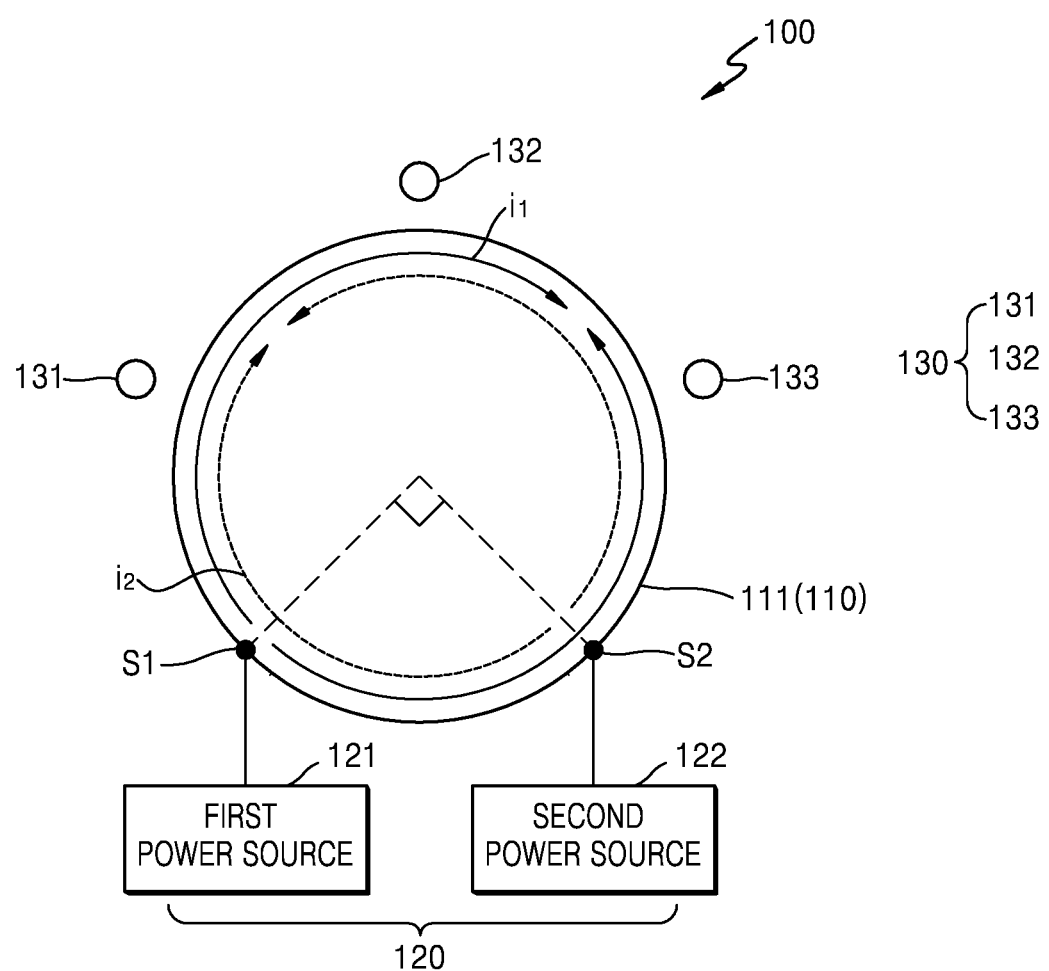
FIG. 9 is a diagram of a first port and a second port of an MRI apparatus, according to an exemplary embodiment.

FIG. 9 is a diagram of a first port S1 and a second port S2 of an MRI apparatus, according to an exemplary embodiment.

Referring to FIG. 9, the first port S1 and the second port S2 via which RF power is supplied to the RF coil 110 may be separated from each other by an interval of about 90° with respect to the endring 111. When the first port S1 and the second port S2 are separated from each other by an interval of about 90° with respect to the endring 111, RF powers supplied by the first power source 121 and the second power source 122 may be mutually orthogonal with respect to each other. Therefore, the RF powers supplied from the first power source 121 and the second power source 122 may drive the RF coil 110 independently.

Figure 10:
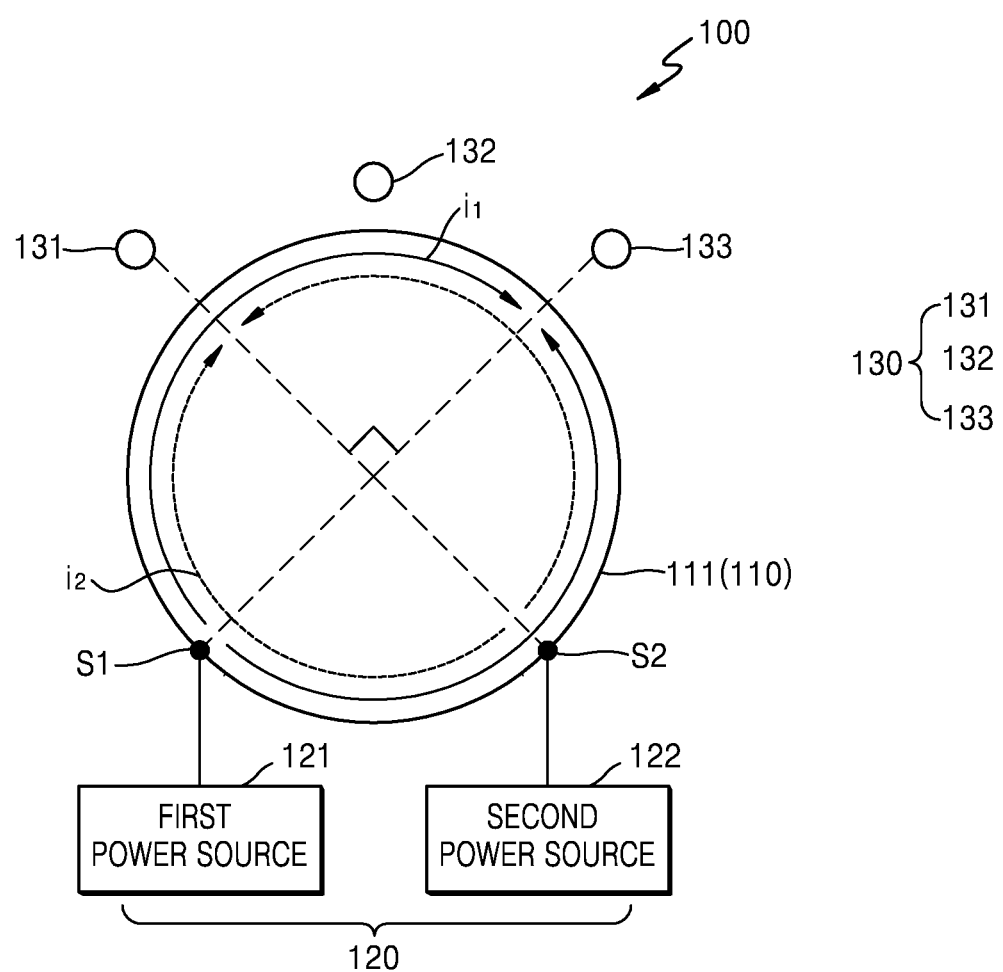
FIG. 10 is a diagram of the arrangement of a first port, a second port, and probes of an MRI apparatus, according to an exemplary embodiment.

FIG. 10 is a diagram of the arrangement of a first port S1, a second port S2, and probes of the MRI apparatus 100, according to an exemplary embodiment.

Referring to FIG. 10, two probes 131 and 133 from among the plurality of probes 131, 132, and 133 included in the MRI apparatus 100 may be arranged at an angular interval of about 90° with respect to the endring 111. Though FIG. 10 illustrates that the first probe 131 and the third probe 133 are arranged at an interval of about 90°, the arrangement is a mere example, and two arbitrary probes from among the plurality of probes 131, 132, and 133 may be arranged at an interval of about 90°.

As described above with reference to FIG. 9, the first port S1 and the second port S2 may be separated from each other by an interval of about 90° with respect to the endring 111. The first port S1, the second port S2, and the two probes 131 and 133 may be respectively arranged at an interval of about 90° with respect to the endring 111.

The second current $i_2$ may be extinct at a point of the endring 111 that corresponds to the first probe 131, and the first current $i_1$ may be extinct at a point of the endring 111 that corresponds to the third probe 133. Therefore, the first voltage V1 induced to the first probe 131 may relate to only the first current $i_1$, and the third voltage V3 induced to the third probe 133 may relate to only the second current $i_2$. Therefore, the controller 150 may estimate the amplitude of the first current $i_1$ from the amplitude of the first voltage V1 and estimate the amplitude of the second current $i_2$ from the amplitude of the third voltage V3. That is, the controller 150 may estimate the amplitude of the first current $i_1$ and the amplitude of the second current $i_2$ by using a relatively small number of operations. As illustrated in FIG. 10, when the first port S1, the second port S2, and the two probes from among the three probes 130 are arranged at an interval of about 90° with respect to the endring 111, an overhead of an operation process of the controller 150 may be reduced.

Figure 11:
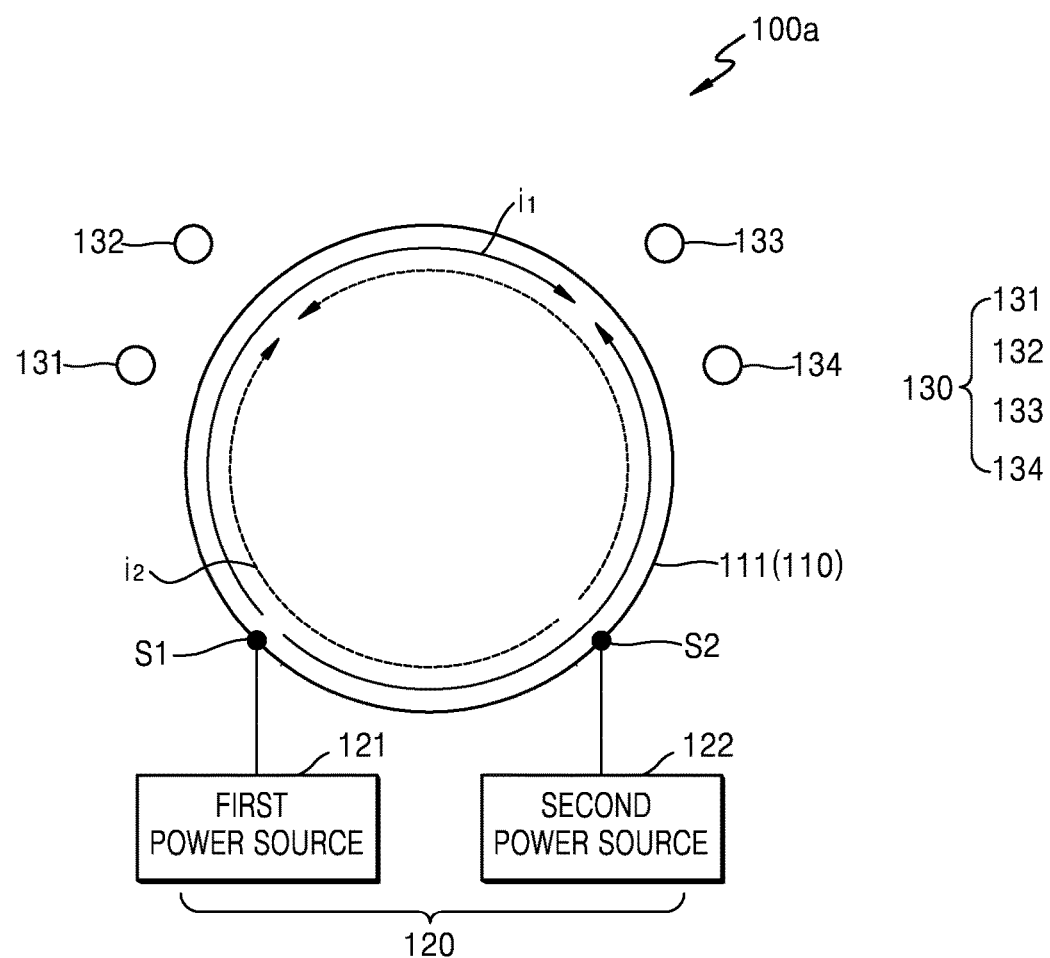
FIG. 11 is a diagram of an MRI apparatus, according to an exemplary embodiment.

FIG. 11 is a diagram of an MRI apparatus 100a, according to an exemplary embodiment.

Referring to FIG. 11, the MRI apparatus 100a includes four probes 131, 132, 133, and 134. The above-described MRI apparatus 100 has been illustrated to include the three probes 131, 132, and 133. Except the number of probes 130, the content of the above-described MRI apparatus 100 is applicable to the MRI apparatus 100a. As described above, since unknowns which the controller 150 intends to obtain are the amplitude of the first current $i_1$, the amplitude of the second current $i_2$, and a phase difference, the three unknowns may be estimated by using the three probes 131, 132, and 133. Also, as illustrated in FIG. 11, an exemplary embodiment which uses the number of probes 131, 132, 133, and 134 greater than the number of unknowns may be possible. The accuracy of the amplitude of the first current $i_1$, the amplitude of the second current $i_2$, and the phase difference estimated by the controller 150 may be raised by using a number of probes 131, 132, 133, and 134 which is greater than the number of unknowns.

FIGS. 7 to 11 illustrate a case where the RF coil 110 receives two independent RF powers, and the current distribution of the RF coil 110 may be represented by a sum of two independent currents $i_1$ and $i_2$. The content described with reference to FIGS. 7 to 11 is applicable to even a case in which the RF coil 110 receives more than two independent RF powers. The current distribution of the RF coil 110 may be represented by a sum of the same number of currents as the number of independently supplied RF powers. That is, the current distribution of the RF coil 110 may be processed via the same number of current modes as the number of RF powers. The controller 150 needs to estimate the amplitudes of respective currents and a phase difference between the currents in order to estimate the current distribution of the RF coil 110.

In the case where the number of current modes is equal to N, the number of unknowns, which are the amplitudes of respective currents and a phase difference between the currents, and which are required by the controller 150, is equal to 2N-1. The MRI apparatus 100 and 100a may include (2N-1) or more probes 130. The voltage detector 140 may detect the amplitudes of respective voltages induced to the probes 130, that is, the amplitudes of (2N-1) or more voltages. The controller 150 may estimate the amplitudes of the respective currents and the phase difference between the currents based on the amplitudes of the (2N-1) or more respective voltages.

Figure 12:
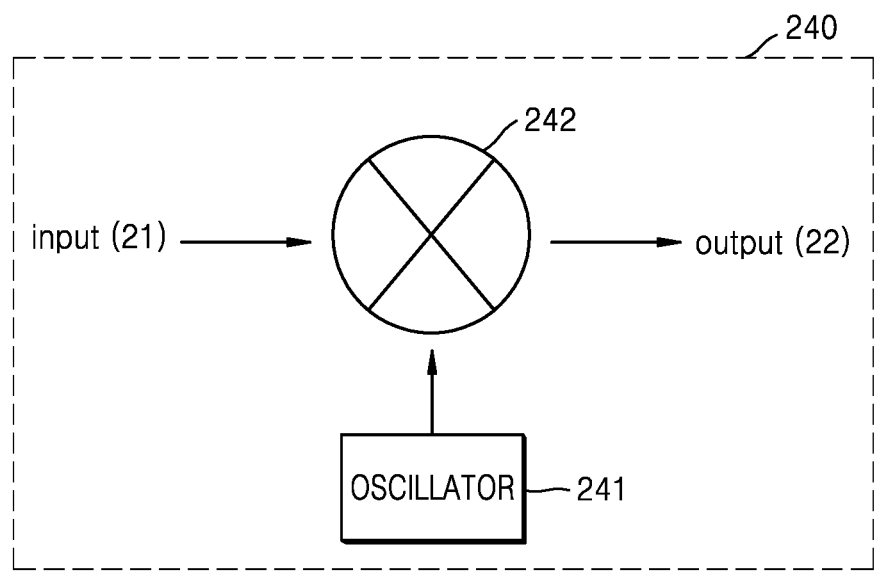
FIG. 12 is a diagram of a voltage detector of an MRI apparatus, according to an exemplary embodiment.

FIG. 12 is a diagram of a voltage detector 240 of an MRI apparatus, according to an exemplary embodiment.

Referring to FIG. 12, the voltage detector 240 may include an oscillator 241 and a mixer 242. Since the voltage detector 240 is a configuration corresponding to the above-described voltage detector 140, repeated description thereof is omitted.

The oscillator 241 may generate a reference signal of a reference frequency and transfer the same to the mixer 242. The mixer 242 may mix an input signal 21 with the reference signal and output an output signal 22. The frequency of the output signal 22 may be lower than the frequency of the input signal 21 by an amount that corresponds to the reference frequency.

The voltage detector 240 may generate the output signal 22 having a frequency lower than the frequency of the input signal 21 via the oscillator 241 and the mixer 242. The voltage detector 240 may detect the amplitude of the output signal 22. The voltage detector 240 may detect the amplitude of the input signal 21 from the amplitude of the detected output signal 22. A method of detecting the input signal 21 by mixing the input signal 21 with the reference signal of the reference frequency as described above is referred to as heterodyne detection.

The voltage detector 240 may detect the amplitude of a voltage induced to a probe via the heterodyne detection. The input signal 21 may be a voltage induced to the probe 130 (see FIG. 7). That is, the voltage detector 240 may generate a voltage whose frequency is lower than the frequency of the voltage induced to the probe 130, detect the amplitude of the voltage whose frequency has been lowered, and detect the amplitude of the voltage induced to the probe 130 from the detected amplitude of the voltage.

FIG. 12 illustrates an example of a case where the voltage detector 240 uses the heterodyne detection, and the heterodyne detection is not limited thereto.

Figure 13:
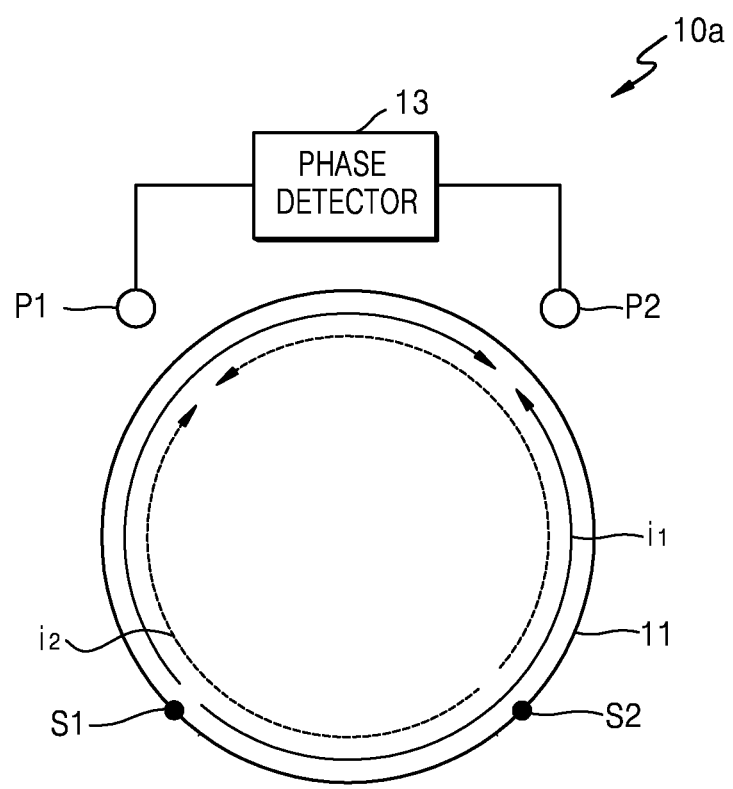
FIG. 13 is a diagram of an MRI apparatus to which an exemplary embodiment is not applied.

FIG. 13 is a diagram of an MRI apparatus 10a to which an exemplary embodiment is not applied.

Referring to FIG. 13, the MRI apparatus 10a to which an exemplary embodiment is not applied includes two probes P1 and P2 arranged adjacent to an endring 11. The endring 11 may receive independent RF powers via the first port S1 and the second port S2. Two currents $i_1$ and $i_2$ may flow through the endring 11.

When the two probes P1 and P2 are used, the MRI apparatus 10a may obtain two equations regarding a relation between respective voltages V1 and V2 induced to the probes P1 and P2 and the first and second currents $i_1$ and $i_2$. However, there are three unknowns which the MRI apparatus 10a intends to obtain, including the amplitude of the first current $i_1$, the amplitude of the second current $i_2$, and a phase difference. That is, since the number of obtained equations is less than the number of unknowns, the unknowns may not be calculated. Likewise, in the case where the MRI apparatus 10a uses the number of probes less than (2N-1) when N RF powers are supplied to the endring 11, the number of obtained equations may be less than the number of unknowns. The MRI apparatus 10a that uses the number of probes less than (2N-1) is an MRI apparatus to which an exemplary embodiment is not applied.

The MRI apparatus 10a to which an exemplary embodiment is not applied may use the following methods in order to resolve the problem.

The MRI apparatus 10a may further include a phase detector 13 in order to further obtain additional information for calculating an unknown. The MRI apparatus 10a may detect the phases of respective voltages induced to the probes P1 and P2 via the phase detector 13. The MRI apparatus 10a may obtain the amplitude of the first current $i_1$, the amplitude of the second current $i_2$, and a phase difference via phase detection and complex demodulation.

Alternatively, the voltage detector of the MRI apparatus 10a may detect not only the amplitudes of the respective voltages induced to the probes P1 and P2 but also the phases of the respective voltages. In this case, the MRI apparatus 10a requires a high-priced voltage detector.

Alternatively, the MRI apparatus 10a may synchronize the phases between a power source and a current monitor (e.g. a voltage detector). Alternatively, for a wide bandwidth, the MRI apparatus 10a may include a high-priced high speed analog-to-digital converter (ADC). The MRI apparatus 10a may synchronize a high-priced high speed ADC with a power source.

In contrast, in the case where the MRI apparatus includes (2N-1) or more probes (where N is equal to the number of current modes), the MRI apparatus may sufficiently include a low-priced ADC. That is, the MRI apparatus according to an exemplary embodiment does not require a high-priced ADC. Also, the MRI apparatus according to an exemplary embodiment does not require synchronization. The MRI apparatus according to an exemplary embodiment may increase a bandwidth by using only a low-priced voltage detector and a low speed ADC. The MRI apparatus according to an exemplary embodiment may achieve significant savings with respect to manufacturing costs.

Meanwhile, the exemplary embodiments may be written as a program executable on a computer and may be implemented on a general-purpose digital computer operating the program by using a non-transitory computer-readable recording medium.

The non-transitory computer-readable recording medium includes a recording medium such as a magnetic recording medium (e.g. ROM, a floppy disk, a hard disk, etc.), an optical readable medium (e.g. a CD-ROM, a DVD, etc.).

Though the exemplary embodiments have been described with reference to the accompanying drawings, a person of ordinary skill in the art will understand that the exemplary embodiments may be embodied in other different forms without changing the spirit of the present inventive concept or essential characteristics. Therefore, the exemplary embodiments should be understood as being merely exemplary, not being limited in all aspects.

What is claimed is:

1. A magnetic resonance imaging apparatus comprising:
a radio frequency (RF) coil comprising an endring;
a power source configured to supply RF power to each of a first port and a second port of the endring;
three probes arranged adjacent to the endring;
a voltage detector configured to detect amplitudes of respective voltages induced to each of the three probes; and
a controller configured to estimate a current of the RF coil based on the detected amplitudes of the respective voltages.

2. The apparatus of claim 1, wherein the power source includes a first power source and a second power source, and the controller is further configured to estimate an amplitude of a first current flowing through the RF coil by using the first power source, to estimate an amplitude of a second current flowing through the RF coil by using the second power source, and to estimate a phase difference between the first current and the second current based on the detected amplitudes of the respective voltages.

3. The apparatus of claim 1, wherein the RF power supplied to the first port of the endring is orthogonal to the RF power supplied to the second port of the endring.

4. The apparatus of claim 1, wherein the first port of the endring is separated from the second port of the endring by an angular interval of about 90° with respect to the endring.

5. The apparatus of claim 4, wherein a first probe and a second probe from among the three probes are arranged at an angular interval of about 90° with respect to the endring, and the first port and the second port are arranged at an angular interval of about 90° with respect to the endring.

6. The apparatus of claim 1, wherein the controller is further configured to estimate at least one from among a coil power loss (CPL) and a specific absorption rate (SAR) based on the estimated current of the RF coil.

7. The apparatus of claim 1, further comprising:
an additional probe arranged adjacent to the endring,
wherein the voltage detector is further configured to detect an amplitude of an additional respective voltage induced to the additional probe, and the controller is further configured to estimate a current of the RF coil further based on the detected amplitude of the additional respective voltage.

8. The apparatus of claim 1, wherein the endring comprises N ports comprising the first port and the second port, N being a natural number greater than or equal to three, the power source is further configured to supply RF power to each of the N ports, the magnetic resonance imaging apparatus further comprises at least (2N-1) probes comprising the three probes, each of the at least (2N-1) probes being arranged adjacent to the endring, the voltage detector is further configured to detect amplitudes of respective voltages induced to each of the at least (2N-1) probes, and the controller is further configured to estimate a current of the RF coil based on the detected amplitudes of the respective voltages.

9. The apparatus of claim 1, wherein the voltage detector is further configured to detect the amplitudes of the respective voltages by using heterodyne detection.

10. The apparatus of claim 9, wherein the voltage detector comprises:
an oscillator configured to generate a reference signal of a reference frequency; and
a mixer configured to mix each of the respective voltages with the reference signal, and to output respective resultant voltages, wherein each respective resultant voltage has a frequency which is lower than a frequency of the corresponding pre-mixed voltage by an amount that corresponds to the reference frequency.

* * * * *